US010862425B2

(12) United States Patent
Emira et al.

(10) Patent No.: US 10,862,425 B2
(45) Date of Patent: Dec. 8, 2020

(54) DIFFERENTIAL SWITCHABLE CAPACITORS FOR RADIOFREQUENCY POWER AMPLIFIERS

(71) Applicant: GOODIX TECHNOLOGY INC., San Diego, CA (US)

(72) Inventors: Ahmed Emira, San Diego, CA (US); Mounir Fares, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/395,222

(22) Filed: Apr. 25, 2019

(65) Prior Publication Data

US 2020/0343857 A1  Oct. 29, 2020

(51) Int. Cl.
*H03B 5/12* (2006.01)
*H03J 3/20* (2006.01)
*H03F 3/191* (2006.01)

(52) U.S. Cl.
CPC .......... *H03B 5/1265* (2013.01); *H03F 3/191* (2013.01); *H03J 3/20* (2013.01); *H03F 2200/451* (2013.01); *H03J 2200/10* (2013.01)

(58) Field of Classification Search
CPC . H03B 5/1265; H03F 3/191; H03F 2200/451; H03J 3/20; H03J 2200/10
See application file for complete search history.

(56) References Cited

U.S. PATENT DOCUMENTS

| 8,044,741 B2 * | 10/2011 | Barton | H03L 7/0991 |
| | | | 331/117 FE |
| 9,755,594 B1 | 9/2017 | Wu et al. | |
| 2006/0145771 A1 * | 7/2006 | Strange | H03B 5/1253 |
| | | | 331/16 |

(Continued)

FOREIGN PATENT DOCUMENTS

| CN | 103001618 A | 3/2013 |
| CN | 106664097 A | 5/2017 |

OTHER PUBLICATIONS

International Search Report dated Jan. 23, 2020 in the corresponding international application (application No. PCT/CN2019/111145).

*Primary Examiner* — Jeffrey M Shin
(74) *Attorney, Agent, or Firm* — Kilpatrick Townsend & Stockton LLP

(57) ABSTRACT

Techniques are described for tuning a resonant circuit using differential switchable capacitors. For example, embodiments can operate in context of a power amplifier with a tunable resonant output network. To tune the network, multiple differential switchable capacitors are provided in parallel. Each differential switchable capacitor can include a pair of capacitors, each coupled between a respective internal node and a respective differential terminal; and the internal nodes are selectively coupled or decoupled using a respective electronic switch (e.g., transistor). Switching on one of the differential switchable capacitors forms a capacitive channel having an associated capacitance. Each differential switchable capacitor can also include a switch network to selectively pull the internal nodes to a high or low voltage reference according to the selected operating mode.

17 Claims, 6 Drawing Sheets

(56) References Cited

U.S. PATENT DOCUMENTS

| | | | | |
|---|---|---|---|---|
| 2007/0247237 A1* | 10/2007 | Mohammadi | ........ | H03B 5/1215 331/36 C |
| 2018/0269862 A1 | 9/2018 | Jia | | |
| 2019/0190465 A1* | 6/2019 | Bechthum | ............ | H03F 1/0211 |

* cited by examiner

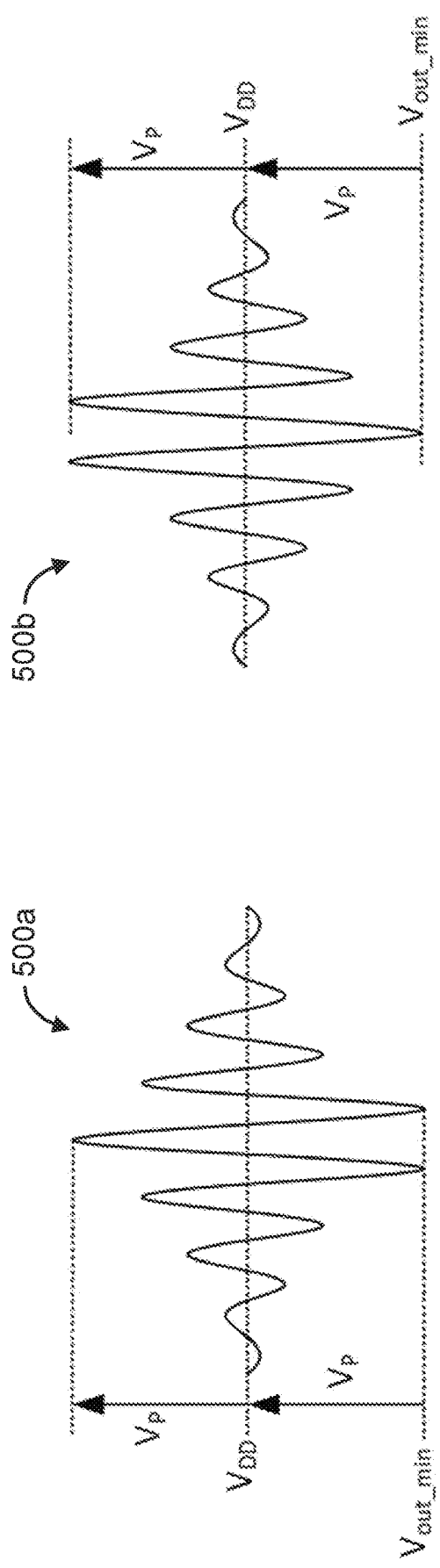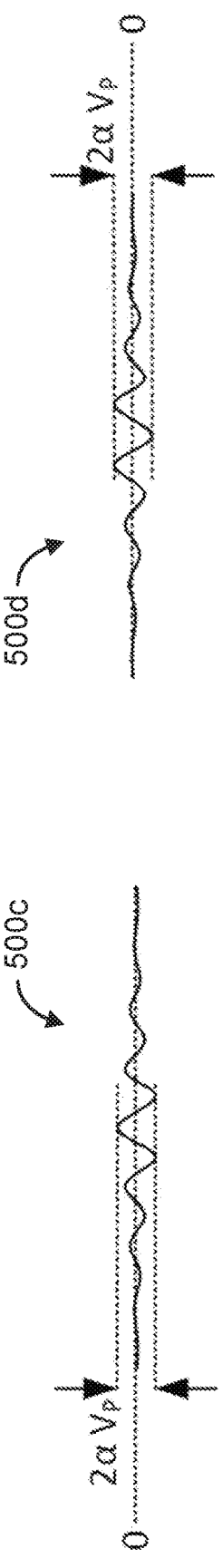
FIG. 5A
FIG. 5B
FIG. 5C
FIG. 5D

DIFFERENTIAL SWITCHABLE CAPACITORS FOR RADIOFREQUENCY POWER AMPLIFIERS

FIELD

The invention relates generally to radiofrequency transceivers. More particularly, embodiments relate to differential switchable capacitors for use in tuning resonant networks of radiofrequency power amplifiers.

BACKGROUND

Many electronic applications involve communications of signals using transceiver circuits (e.g., transmitter circuits and/or receiver circuits). The transceiver circuits can include radiofrequency power amplifiers and resonant networks. The power amplifiers can add a desirable amount of gain to a signal, and the resonant networks can be used to tune the output of the power amplifier to a desired frequency. For example, a capacitor and inductor can be used as a resonating circuit, and the values of the capacitor and inductor can effectively define the frequency of the resonating circuit.

Often, it is desirable to design a transceiver circuit to operate in difference frequency bands. For example, a cellular telephone transceiver may be designed to selectively operate in different types of networks (e.g., for different companies, different countries, etc.). Re-tuning the transceiver can involve using a tunable resonant circuit. Such circuits can be designed with multiple capacitors that can be selectively coupled with a single inductor, so that selecting a particular capacitor can effectively select a particular resonant frequency for the circuit.

During operation, there can tend to be a relatively large voltage swing at the outputs of the radiofrequency power amplifiers. When the switch is ON (i.e., the capacitor is being used in the resonant circuit), the switch may see only a relatively small voltage swing. However, when the switch is OFF (i.e., the capacitor is not being used), the full output voltage swing from the power amplifier may be transferred to the switch. The switch is conventionally implemented as a typical transistor (e.g., a complementary metal-oxide semiconductor, CMOS, transistor), which can have a relatively low stress voltage. As such, when the switch is OFF, the large voltage swing can cause degradation of the transistor and/or other undesirable conditions.

To avoid such concerns, various conventional approaches are used. Some conventional applications simply avoid such concerns by selecting a single capacitor, such that the resonant circuit is not tunable. Other conventional approaches use one or more off-chip capacitors, which can be selectively coupled into the circuit, for example, by selectively hard-wiring a particular one of the capacitors to the circuit, by using a physical switch component (e.g., a dip switch), etc.

BRIEF SUMMARY OF THE INVENTION

Embodiments provide circuits, devices, and methods for tuning a resonant circuit using differential switchable capacitors. For example, embodiments can operate in context of a power amplifier with a tunable resonant output network. To tune the network, multiple differential switchable capacitors are provided in parallel. Each differential switchable capacitor can include a pair of capacitors, each coupled between a respective internal node and a respective differential terminal; and the internal nodes are selectively coupled or decoupled using a respective electronic switch (e.g., transistor). Switching on one of the differential switchable capacitors forms a capacitive channel having an associated capacitance. Each differential switchable capacitor can also include a switch network to selectively pull the internal nodes to a high or low voltage reference according to the selected operating mode.

According to one set of embodiments, a switchable capacitor system is provided. The system includes a differential switchable capacitor, which includes: a positive differential terminal; a negative differential terminal; a capacitor control switch (CCS) having a positive CCS node and a negative CCS node, the CCS to selectively toggle between a first mode and a second mode in response to a CCS control signal; a first capacitor coupled between the positive CCS node and the positive differential terminal; a second capacitor coupled between the negative CCS node and the negative differential terminal; and a switch network to selectively toggle between the first mode and the second mode in response to a switch network control signal, such that in the first mode, the switch network is to pull the positive CCS node and the negative CCS node to a low reference voltage level, and in the second mode, the switch network is to pull the positive CCS node and the negative CCS node to a high reference voltage level.

According to another set of embodiments, a transceiver system is provided. The system includes: a power amplifier to generate an output signal at an output terminal as a function of applying gain to an input signal; and a resonant circuit comprising an inductor and a switchable capacitor system, the switchable capacitor system comprising a plurality of differential switchable capacitors. Each differential switchable capacitor includes: a positive differential terminal coupled with the output terminal to receive a first differential input signal responsive to the output signal; a negative differential terminal; a capacitor control switch (CCS) having a positive CCS node and a negative CCS node, the CCS to selectively toggle between a first mode and a second mode in response to a CCS control signal; a first capacitor coupled between the positive CCS node and the positive differential terminal; a second capacitor coupled between the negative CCS node and the negative differential terminal; and a switch network to selectively toggle between the first mode and the second mode in response to a switch network control signal, such that in the first mode, the switch network is to pull the positive CCS node and the negative CCS node to a low reference voltage level, and in the second mode, the switch network is to pull the positive CCS node and the negative CCS node to a high reference voltage level.

According to another set of embodiments, a method is provided for tuning a resonant circuit using differential switchable capacitors. The method includes: applying a capacitor control switch (CCS) control signal to a switchable capacitor system having a plurality of differential switchable capacitors, the CCS control signal identifying a differential switchable capacitor of the plurality of differential switchable capacitors, such that applying the CCS control signal causes the identified differential switchable capacitor to turn ON, thereby coupling a positive differential terminal with a negative differential terminal via a capacitive channel of the identified differential switchable capacitor, the capacitive channel being one of a plurality of capacitive channels, each capacitive channel comprised by a respective one of the plurality of differential switchable capacitors, and each capacitive channel having an associated capacitance defined by a respective first capacitor and a respective second capacitor and having a respective CCS responsive to the CCS control signal, each respective first capacitor coupled between the respective CCS and the positive differential terminal, and each respective second capacitor coupled between the respective CCS and the negative differential terminal; applying a first data signal to the positive differential terminal, the first data signal corresponding to an output signal from a power amplifier in electrical communication with the positive differential terminal; and applying a second data signal to the negative differential terminal.

BRIEF DESCRIPTION OF THE DRAWINGS

The accompanying drawings, referred to herein and constituting a part hereof, illustrate embodiments of the disclosure. The drawings together with the description serve to explain the principles of the invention.

FIGS. 5A-5D show illustrative plots of the signals seen by embodiments of novel differential switchable capacitors described herein, such as the differential switchable capacitor of FIG. 4;

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
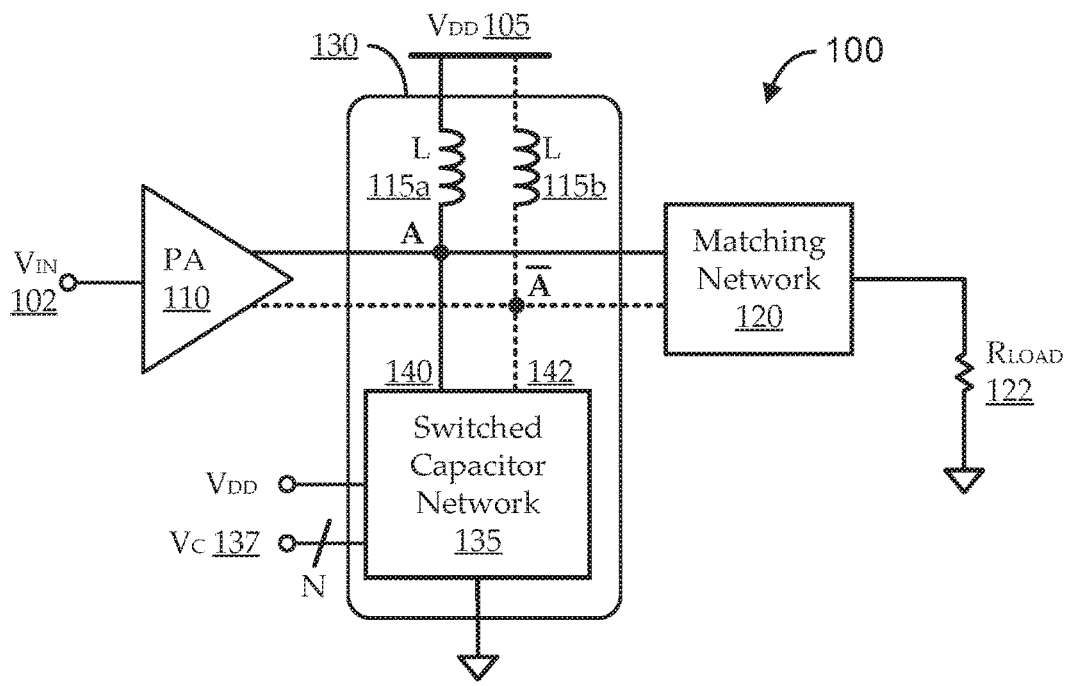
FIG. 1 shows a block diagram of an illustrative radiofrequency transceiver power amplifier circuit for use with embodiments described herein.

For the sake of context, FIG. 1 shows a block diagram of an illustrative radiofrequency transceiver power amplifier circuit 100 for use with embodiments described herein. The illustrative transceiver power amplifier circuit 100 includes a power amplifier 110, a resonant circuit 130, and a matching network 120 coupled with a load (illustrated as load resistor 122). Embodiments of the power amplifier 110 operate to add gain to an input signal 102, thereby generating an amplified output signal at node "A". Embodiments of the matching network 120 can impedance-match the load 122 to the output of the power amplifier 110 at node "A".

Many applications of power amplifiers 110 include a resonant output network. Conventionally, the resonant output network can include an inductor and a capacitor in parallel to form an inductor-capacitor (LC) resonator. In such an LC resonator, the resonant frequency is a function of the inductance of the inductor and the capacitance of the capacitor, as follows:

$$f_0 = \frac{1}{2\pi\sqrt{LC}}$$

where L is the inductance of the inductor (henrys), C is the capacitance of the capacitor (farads), and $f_0$ is the resonant frequency in hertz. Setting the resonant frequency of the LC resonator to the frequency (or frequency band) of the output signal of the power amplifier 110 tends to maximize the output power from the power amplifier 110.

In many applications, the output of the power amplifier 110 can vary in frequency. For example, the same transceiver power amplifier circuit 100 can be designed to operate in different frequency bands for different communication networks. In such cases, it can be desirable to maintain maximum output power from the power amplifier 110, even though the output frequency is changing. Thus, it can be desirable to design the LC resonator to be tunable. For example, coupling the inductor with a variable capacitance can change the resonant frequency of the LC resonator.

Embodiments of the resonant circuit 130 can operate to effectively oscillate at a desired, tunable resonant frequency. As illustrated, the resonant circuit 130 can include an inductor 115 and a switched capacitor network 135. The switched capacitor network 135 can include a number of capacitors that can be selectively (e.g., digitally selected to be) coupled with the inductor 115 to form an LC resonator. By using the switched capacitor network 135 to select different capacitors with different capacitance values, the resonant circuit 130 can be tuned to different resonant frequencies. As illustrated, the inductor 115 can be coupled between a high reference voltage level ($V_{DD}$) 105 and node A; and the switched capacitor network 135 can be coupled between node A and a low reference voltage level (e.g., ground). Each capacitor in the switched capacitor network 135 can be controlled (e.g., switched ON or OFF) using one or more control signals ($V_C$) 137.

Embodiments described herein exploit differential operation of such a transceiver power amplifier circuit 100. As illustrated, some implementations include differential paths (e.g., using two inductors 115a, 115b). For example, according to novel implementations described herein, the switched capacitor network 135 can receive both an "A" node signal 140 and a complementary "$\overline{A}$" node signal 142. Embodiments use the two signals 140 and 142 as differential inputs. Other embodiments can generate the differential signals in any other suitable manner.

Figure 2:
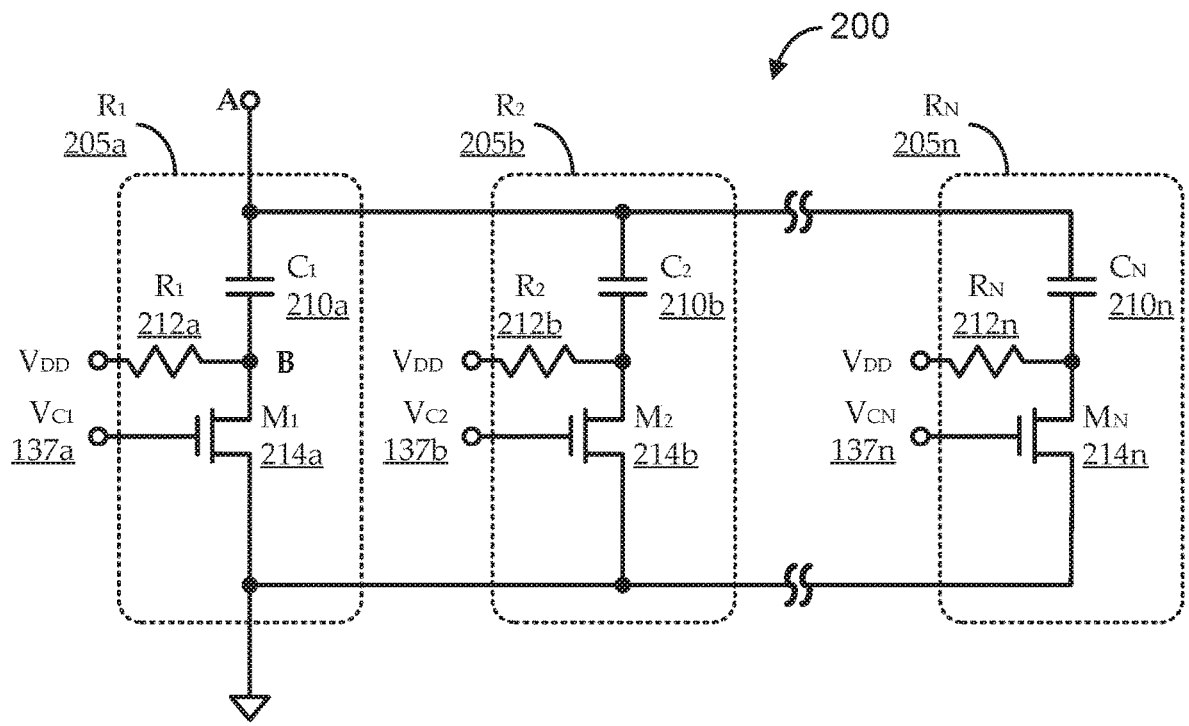
FIG. 2 shows an illustrative implementation of a conventional switched capacitor network.

The switched capacitor network 135 can be implemented in various ways. FIG. 2 shows an illustrative implementation of a conventional switched capacitor network 200. As illustrated, the conventional switched capacitor network 200 includes multiple switchable capacitors 205. Each of the switchable capacitors 205 is coupled between node A (the output of the power amplifier 110 of FIG. 1) and ground. Each of the switchable capacitors 205 includes a capacitor 210, a bias resistor 212, and a transistor 214. The transistor 214 is implemented as a metal-oxide semiconductor (MOS) transistor and is configured as a switch. For example, if the transistor 214 is implemented using a negative MOS (NMOS) transistor, as shown, asserting the control voltage signal 137 (e.g., with a logical HIGH voltage level) effectively turns ON the switch. This can permit current to flow through the transistor 214, thereby providing a capacitive channel from node A to ground through the capacitor 210 coupled with that particular transistor 214. As an example, asserting control voltage signal 137b turns ON transistor 214b, thereby forming a capacitive channel through capacitor 210b (i.e., turning ON switchable capacitor 205b).

Such a conventional approach can be effective in some applications. Different capacitance values can be provided by switching ON different ones of the switchable capacitors 205 with different respective capacitance values, and/or switching ON multiple of the switchable capacitors 205 concurrently. However, in certain applications, during operation, there can be a relatively large voltage swing at the output of the power amplifier 110 (i.e., at node A). When a particular one of the transistors 214 is switched ON, the transistor 214 may see only a relatively small voltage swing at node B (i.e., the transistor 214 is acting similar to a short circuit). However, when the particular transistor 214 is switched OFF, the full output voltage swing from the power amplifier 110 may be transferred to the transistor 214 at node B (i.e., the transistor 214 is acting effectively as an open circuit). Typical MOS transistors used in such applications can tend to have relatively low stress voltages, and the high power amplifier 110 output voltage swing can cause degradation of the transistors and/or other undesirable conditions.

Figure 3A:
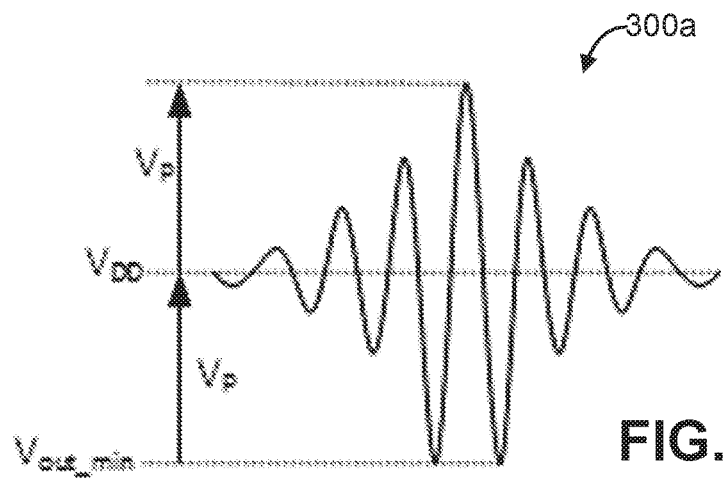
FIGS. 3A-3C show illustrative plots of the signals seen by a conventional switchable capacitor of FIG. 2.
Figure 3B:
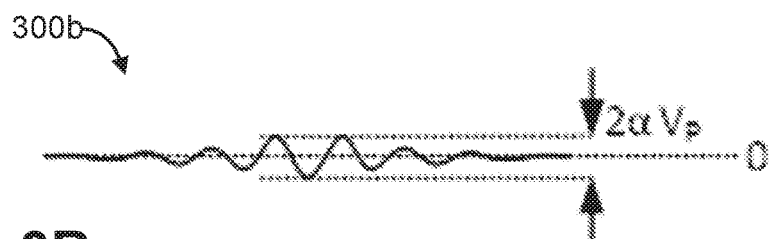
Figure 3C:
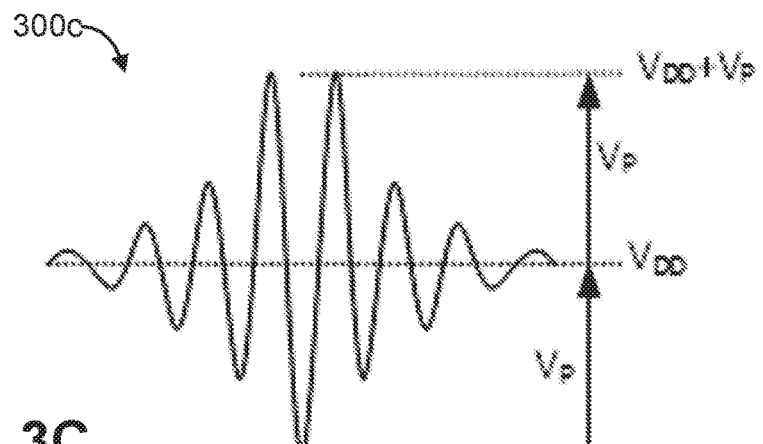

For example, FIGS. 3A-3C show illustrative plots 300 of the signals seen by a conventional switchable capacitor 205 of FIG. 2. FIG. 3A shows an illustrative power amplifier 110 output signal, such as could be seen at node A. For example, the signal in FIG. 3A can be a portion of an amplitude-modulated radiofrequency signal. As shown, the signal can have a voltage swing around $V_{DD}$, and the peak voltage swing ($V_P$) can be characterized as an absolute magnitude voltage difference between $V_{DD}$ and a maximum or minimum voltage output of the signal.

FIG. 3B shows a plot 300b of an illustrative signal that can be seen at internal node B of the switchable capacitor 205 in response to the power amplifier 110 output signal of FIG. 3A, when the switchable capacitor 205 is ON. When the switchable capacitor 205 is ON (i.e., current is flowing through the transistor 214), its capacitor 210 is effectively connected to the power amplifier 110 output, and the swing at the internal node B can be characterized as $2\alpha V_P$, where $\alpha=\omega C_{1p}R_{ON}$ ($R_{ON}$ is the ON resistance of the transistor 214). The equivalent quality factor of the capacitor 210 can be characterized as $Q=1/(\omega C_{1p}R_{ON})$.

FIG. 3C shows a plot 300c of an illustrative signal that can be seen at internal node B of the switchable capacitor 205 in response to the power amplifier 110 output signal of FIG. 3A, when the switchable capacitor 205 is OFF. When the switchable capacitor 205 is OFF (i.e., current is not flowing through the transistor 214), the internal node B is biased at $V_{DD}$ using the large bias resistor 212. In this mode, the maximum voltage seen by the transistor 214 (the maximum drain-to-gate voltage ($V_{DG}$) and the maximum drain to source voltage ($V_{DS}$) is $V_P+V_{DD}$. Such a large voltage swing can cause stress on the transistor 214, potentially resulting in voltage breakdown.

To avoid such concerns, various conventional approaches are used. Some conventional approaches simply avoid such concerns by selecting a single capacitor, such that the resonant circuit is not tunable. Other conventional approaches provide a node (e.g., a pin) by which an off-chip capacitor of a selected value can be coupled with an on-chip inductor to tune the circuit for a particular application. Other conventional approaches can provide multiple capacitor options, which can be physically coupled with, or decoupled from, the inductor using by hard-wiring (e.g., forming or severing a conductive pathway), by using a physical switch component (e.g., a dip switch), etc. However, none of these approaches permit digital switching (e.g., using conventional transistor logic) of the capacitor options.

Embodiments described herein include novel approaches to tunable output networks for radiofrequency power amplifiers in a manner that permits transistor-switching of capacitor options, while reducing stress on the transistor switches. In particular, embodiments include differential switchable capacitors. Some implementations include double-ended differential switchable capacitors, and other implementations include single-ended differential switchable capacitors.

Figure 4:
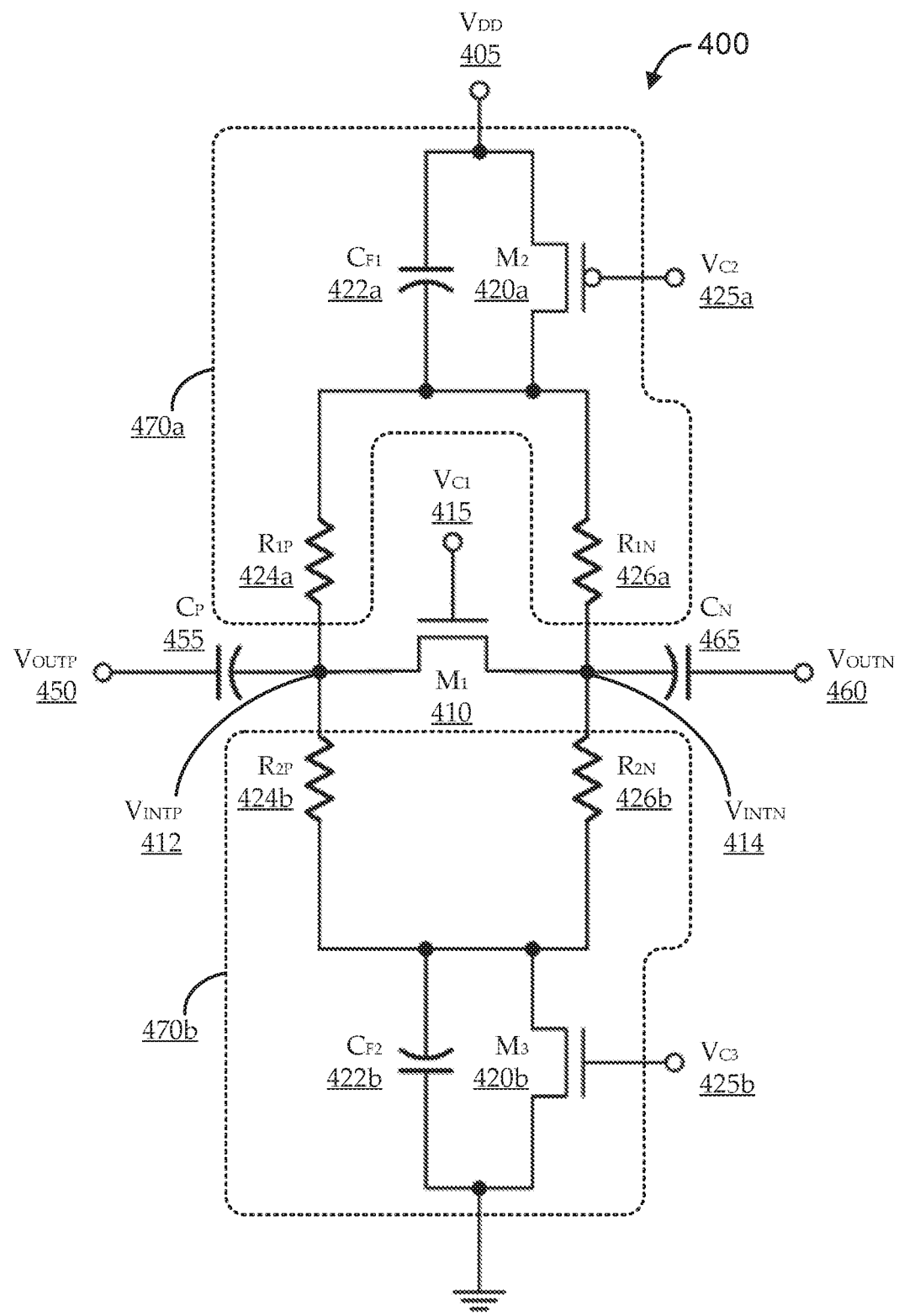
FIG. 4 shows a circuit diagram of an illustrative double-ended differential switchable capacitor, according to various embodiments.

FIG. 4 shows a circuit diagram of an illustrative double-ended differential switchable capacitor 400, according to various embodiments. The differential switchable capacitor 400 can include a positive differential terminal 450, a negative differential terminal 460, a capacitor control switch (CCS) 410, a first capacitor 455, a second capacitor 465, and a switch network 470. Embodiments of the CCS 410 have a positive CCS node 412 and a negative CCS node 414. The CCS 410 operates to selectively toggle between a first mode and a second mode (e.g., ON and OFF modes) in response to a CCS control signal 415. For example, the CCS 410 is a MOS transistor (e.g., an NMOS), and the CCS control signal 415 can be used to turn the CCS 410 (transistor) ON or OFF (i.e., such that the CCS 410 conducts or does not conduct, respectively). As illustrated, the first capacitor 455 can be coupled between the positive CCS node 412 and the positive differential terminal 450, and the second capacitor 465 can be coupled between the negative CCS node 414 and the negative differential terminal 460. In such a configuration, turning the CCS 410 ON permits current to flow between the positive differential terminal 450 and the negative differential terminal 460 through the first capacitor 455 and the second capacitor 465. This can be considered as forming a capacitive channel through the differential switchable capacitor 400.

Embodiments of the switch network 470 can selectively toggle between the first mode and the second mode in response to a switch network control signal 425. In the first mode, the switch network 470 is to pull the positive CCS node 412 and the negative CCS node 414 to a low reference voltage level (e.g., ground). In the second mode, the switch network 470 is to pull the positive CCS node 412 and the negative CCS node 414 to a high reference voltage level (e.g., $V_{DD}$ 405). In the double-ended implementation shown in FIG. 4, the switch network 470 can include two portions, and each portion can include a respective switch 420, positive bias resistor 424, and negative bias resistor 426. In some implementations, each positive bias resistor 424 and negative bias resistor 426 are relatively large resistors (e.g., 10 kilo-ohms, 100 kilo-ohms, etc.), such that the bias resistors have higher impedance than the first capacitor 455 and the second capacitor 465 at the operating radiofrequency frequency range. In each portion of the switch network 470, the positive bias resistor 424 and negative bias resistor 426 can have nominally identical resistance values. In some implementations, the positive bias resistors 424 and negative bias resistors 426 in both portions of the switch network 470 have nominally identical resistance values. In some implementations, each portion of the switch network 470 can also include a respective filter capacitor 422 to filter the drain of its respective switch 420. For example, the filtering can be helpful in case where there is an imbalance between the differential terminals 450 and 460 (e.g., where the positive bias resistor 424 and negative bias resistor 426 in a portion of the switch network 470 do not provide equal resistance).

In the first mode, the differential switchable capacitor 400 is turned ON by turning ON the CCS 410, turning ON the switch 420b of the second portion of the switch network 470b, and turning OFF the switch 420a of the first portion of the switch network 470a. For example, in the implementation shown in FIG. 4, the CCS 415 is an NMOS transistor, switch 420a is a PMOS transistor, and switch 420b is an NMOS transistor. In such an implementation, the differential switchable capacitor 400 is turned ON by applying $V_{DD}$ 405 to the gates of all of CCS 410, switch 420b, and switch 420a. Turning ON the CCS 410 effectively electrically couples the first capacitor 455 with the second capacitor 465, thereby forming a capacitive channel between the positive differential terminal 450 and the negative differential terminal 460. Concurrently turning the second portion of the switch network 470b ON (and turning the first portion of the switch network 470a OFF) can effectively cause the first capacitor 455 to be coupled between the positive differential terminal 450 and ground (via bias resistor 424b), and can cause the second capacitor 465 to be coupled between the negative differential terminal 460 and ground (via bias resistor 426b). As such, the positive CCS node 412 and the negative CCS node 414 are biased to ground. During operation, the swing at the positive CCS node 412 and the negative CCS node 414 can be characterized as $2\alpha V_P$, where $\alpha = \omega C_{1p} R_{ON}/2$. The equivalent quality factor of the capacitor (including the first capacitor 455 with the second capacitor 465) is $Q=2/(\omega C_{1p}R_{ON})$. Notably, this is double the quality factor of the conventional approach illustrated in FIGS. 2 and 3B.

In the second mode, the differential switchable capacitor 400 is turned OFF by turning OFF the CCS 410, turning ON switch 420a, and turning OFF switch 420b. For example, in the implementation shown in FIG. 4, the differential switchable capacitor 400 is turned OFF by applying a low voltage $V_B$ to the gate of CCS 410, and applying a zero voltage to the gates of switch 420a and switch 420b. Turning OFF the CCS 410 effectively electrically decouples the first capacitor 455 from the second capacitor 465. Concurrently turning the first portion of the switch network 470a ON (and turning the second portion of the switch network 470b OFF) can effectively cause the first capacitor 455 to be coupled between the positive differential terminal 450 and $V_{DD}$ 405 (via bias resistor 424a), and can cause the second capacitor 465 to be coupled between the negative differential terminal 460 and $V_{DD}$ 405 (via bias resistor 426a). This effectively biases the positive CCS node 412 and the negative CCS node 414 to $V_{DD}$ 405. As noted above, $V_{DD}-V_P$ defines a minimum voltage level ($V_{OUT\_MIN}$) of the voltage signal seen at the positive CCS node 412 and the negative CCS node 414. As such, ensuring that the CCS 410 stays OFF can involve biasing the gate of CCS 410 to a $V_B$, such that $V_B-V_{OUT\_MIN}$ is less that the threshold voltage ($V_T$) of the CCS 410. For example, The gate of the CCS 410 can be biased at $V_B=V_{DD}-V_P$. In such a case, the maximum drain-to-gate voltage ($V_{DG}$) and source-to-gate voltage ($V_{SG}$) across the switch can be characterized as $V_{DG\_MAX}=V_{DD}+V_P-(V_{DD}-V_P)=2V_P$. Where $V_P$ is less than $V_{DD}$, the maximum $V_{DG}$ value is lower than that of the conventional approach illustrated in FIGS. 2 and 3C (shown to be $V_{DD}+V_P$).

For added clarity, FIGS. 5A-5D show illustrative plots 500 of the signals seen by embodiments of novel differential switchable capacitors described herein, such as the differential switchable capacitor 400 of FIG. 4. FIGS. 5A and 5B show an illustrative power amplifier 110 output signal as received differentially by the differential terminals of the differential switchable capacitor (e.g., the positive differential terminal 450 and the negative differential terminal 460). As illustrated, the signal shown in the plot 500b of FIG. 5B is complementary to (e.g., an inversion of) the signal shown in the plot 500a of FIG. 5A. One of the differential terminals can receive a signal that corresponds directly to the power amplifier 110 output signal, and the other of the differential terminals can receive a signal that corresponds to a complement of the power amplifier 110 output signal. In one implementation, the power amplifier 110 can output differential signals, and each differential output signal is received by a corresponding one of the differential terminals. In another implementation, one differential terminal is coupled directly with the output of the power amplifier 110, and the other differential terminal is coupled with the output of the power amplifier 110 via an inverter (e.g., an inverting operational amplifier, or the like) that generates the complementary signal. As described above, the signals can have a voltage swing around $V_{DD}$, and the peak voltage swing ($V_P$) can be characterized as an absolute magnitude voltage difference between $V_{DD}$ and a maximum or minimum voltage output of the signal.

As described above, when the differential switchable capacitor is OFF, the CCS of the differential switchable capacitor is OFF, and the internal nodes (positive CCS node 412 and negative CCS node 414) are biased to $V_{DD}$ 405. In this mode, the voltage signal seen at the internal nodes substantially matches the voltage signals seen at the differential terminals. For example, the voltage signal seen at the positive CCS node tracks the voltage signal seen at the positive differential terminal, and the voltage signal seen at the negative CCS node tracks the voltage signal seen at the negative differential terminal. Accordingly, FIGS. 5A and 5B can also describe the voltage signal seen at the internal nodes when the differential switchable capacitor is OFF.

FIGS. 5C and 5D show plots 500c and 500d of illustrative signals that can be seen at internal nodes of the differential switchable capacitor in response to the differential power amplifier 110 output signals of FIGS. 5A and 5B, when the differential switchable capacitor is ON. When the differential switchable capacitor is ON, the CCS of the differential switchable capacitor is ON, and the internal nodes (positive CCS node and negative CCS node) are biased to ground. In this mode, the swing at the positive CCS node and the negative CCS node can be characterized as $2\alpha V_P$, where $\alpha = \omega C_{1p}R_{ON}/2$. As noted above, regarding the corresponding swing in the conventional approach of FIGS. 2 and 3B, $\alpha = \omega C_{1p}R_{ON}$. As such the novel differential switchable capacitor sees effectively half the swing as that of the conventional approach, when in the ON mode. Correspondingly, while the equivalent quality factor of the capacitor in the conventional switched capacitor of FIG. 2 was shown to be $Q=1/(\omega C_{1p}R_{ON})$, the equivalent quality factor of the capacitor in the novel differential switchable capacitor (e.g., of FIG. 4) can be characterized as $Q=2/(\omega C_{1p}R_{ON})$; the quality factor of the capacitor in the differential switchable capacitor can be double that of the conventional switched capacitor.

Figure 6:
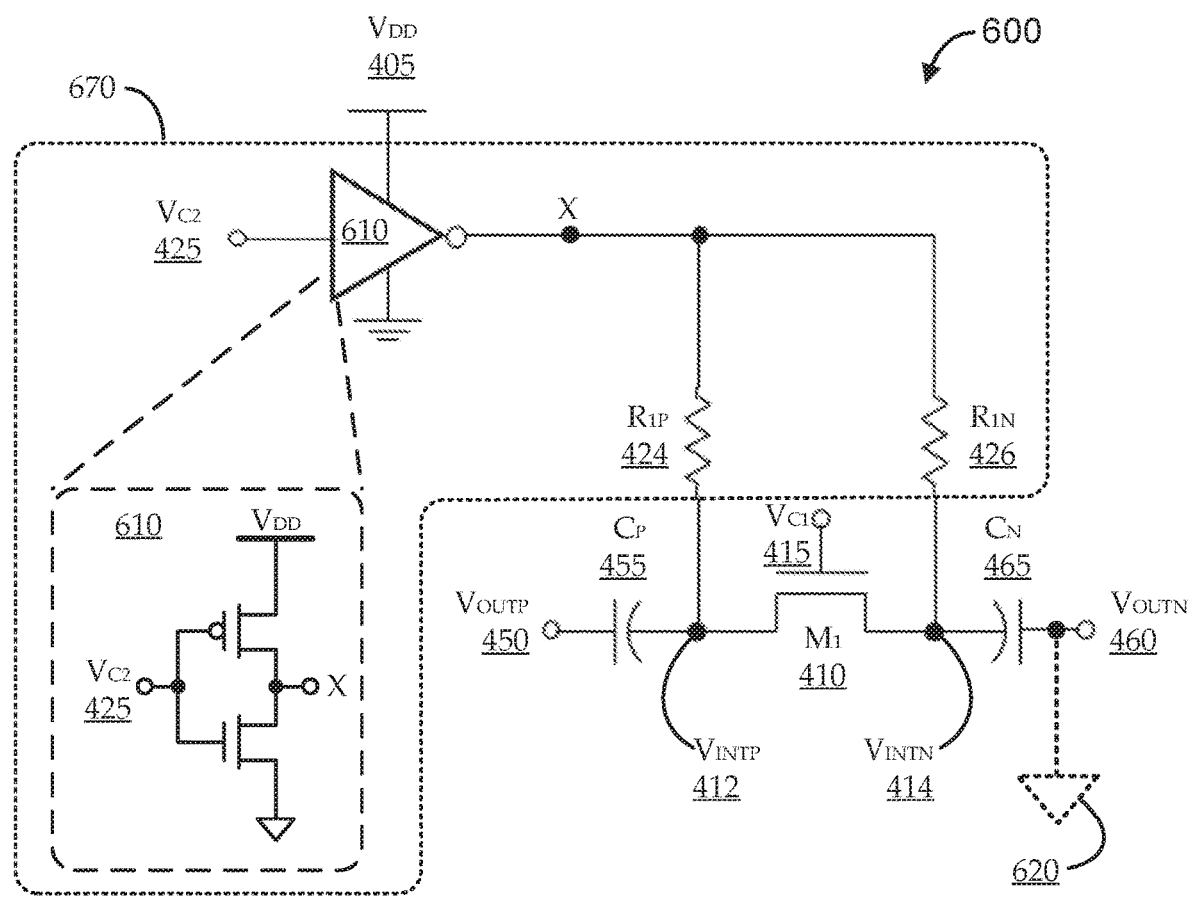
FIG. 6 shows a circuit diagram of another illustrative differential switchable capacitor, according to various embodiments.

FIG. 6 shows a circuit diagram of another illustrative differential switchable capacitor 600, according to various embodiments. The differential switchable capacitor 600 can operate in a substantially similar manner to that of the differential switchable capacitor 400 of FIG. 4. As shown, the differential switchable capacitor 600 includes a positive differential terminal 450, a negative differential terminal 460, a capacitor control switch (CCS) 410, a first capacitor 455, a second capacitor 465, and a switch network 670. Embodiments of the CCS 410 have a positive CCS node 412 and a negative CCS node 414. The CCS 410 operates to selectively toggle between a first mode and a second mode (e.g., ON and OFF modes) in response to a CCS control signal 415. For example, the CCS 410 is a MOS transistor (e.g., an NMOS), and the CCS control signal 415 can be used to turn the CCS 410 (transistor) ON or OFF (i.e., such that the CCS 410 conducts or does not conduct, respectively). As illustrated, the first capacitor 455 can be coupled between the positive CCS node 412 and the positive differential terminal 450, and the second capacitor 465 can be coupled between the negative CCS node 414 and the negative differential terminal 460. In such a configuration, turning the CCS 410 ON permits current to flow between the positive differential terminal 450 and the negative differential terminal 460 through the first capacitor 455 and the second capacitor 465. This can be considered as forming a capacitive channel through the differential switchable capacitor 600.

Embodiments of the switch network 670 can selectively toggle between the first mode and the second mode in response to a switch network control signal 425. In the first mode, the switch network 670 is to pull the positive CCS node 412 and the negative CCS node 414 to a low reference voltage level (e.g., ground). In the second mode, the switch network 670 is to pull the positive CCS node 412 and the negative CCS node 414 to a high reference voltage level (e.g., $V_{DD}$ 405). In the single-ended implementation shown in FIG. 6, the switch network 470 includes an inverter 610. The inverter can include two switched implemented as complementary MOS (CMOS) transistors. For example, a PMOS transistor is coupled between $V_{DD}$ 405 and an output node "X", and an NMOS transistor is coupled between the X node and ground. The CCS control signal 415 can be coupled to the gates of both CMOS transistors. As such, asserting the CCS control signal 415 (e.g., biasing the CCS control signal 415 to $V_{DD}$ 405) turns OFF the PMOS transistor and turns ON the NMOS transistor, thereby pulling the X node to ground; and de-asserting the CCS control signal 415 (e.g., biasing the CCS control signal 415 to ground) turns ON the PMOS transistor and turns OFF the NMOS transistor, thereby pulling the X node to $V_{DD}$ 405.

As shown, the positive CCS node 412 can be coupled to the X node (the output of the inverter 610) via a positive bias resistor 442, and the negative CCS node 414 can be coupled to the X node via a negative bias resistor 446. As such, asserting the CCS control signal 415 effectively pulls the positive CCS node 412 and the negative CCS node 414 to ground (via the positive bias resistor 442 and the negative bias resistor 446); and de-asserting the CCS control signal 415 effectively pulls the positive CCS node 412 and the negative CCS node 414 to $V_{DD}$ 405 (via the same positive bias resistor 442 and the same negative bias resistor 446). As described with reference to FIG. 4 above, the differential switchable capacitor 600 can operate in ON and OFF modes. In the ON mode, the differential switchable capacitor 600 is turned ON by turning ON the CCS 410 and asserting the CCS control signal 415 (i.e., biasing the internal nodes to ground). In the OFF mode, the differential switchable capacitor 600 is turned OFF by turning OFF the CCS 410 and de-asserting the CCS control signal 415 (i.e., biasing the internal nodes to $V_{DD}$ 405).

As illustrated, some embodiments of the differential switchable capacitors described herein can operate in single-ended or double-ended configurations. For example, the differential switchable capacitor 600 can be implemented in a single-ended configuration by tying its negative differential terminal 460 to ground (illustrated in FIG. 6 as the dashed path to ground node 620).

FIGS. 4 and 6 show two possible implementations of differential switchable capacitors, as described herein. Referring back to FIG. 1, the switched capacitor network 135 can include multiple of the differential switchable capacitors arranged in parallel. The switched capacitor network 135 can include master differential inputs, shown as a master positive node 140 (corresponding to node A), and a master negative node 142 (corresponding to a complement of node A, or $\overline{A}$). The positive differential terminal 450 of each of the differential switchable capacitors is coupled with the master positive node 140, and the negative differential terminal 160 of each of the differential switchable capacitors is coupled with the master negative node 142. A master CCS control signal 137 can be used to direct the CCS control signal 415 of each differential switchable capacitor, thereby directing each differential switchable capacitor to be in its ON or OFF mode. The master CCS control signal 137 can be implemented as a single signal or multiple signals, and each signal can be implemented in any suitable manner. In one implementation, there are N differential switchable capacitors (e.g., N being an integer greater than one), and the master CCS control signal 137 is an N-bit signal. In such an implementation, each bit can be associated with a respective one of the differential switchable capacitors, such that each differential switchable capacitor can be selectively toggled between the first (e.g., ON) mode and the second (e.g., OFF) mode responsive to the associated bit of the CCS control signal. For example, if N is five, a master CCS control signal 137 of '01000' can be used to turn on the second of the five differential switchable capacitors; or a master CCS control signal 137 of '01100' can be used to turn on the second and third of the five differential switchable capacitors (in implementations that permit concurrent activation of multiple of the differential switchable capacitors).

As illustrated, some embodiments of the differential switchable capacitors described herein can operate in single-ended or double-ended configurations. For example, the differential switchable capacitor 600 can be implemented in a single-ended configuration by tying its negative differential terminal 460 to ground (illustrated in FIG. 6 as the dashed path to ground node 620). In such a configuration, one or more (e.g., all) of the so-called differential switchable capacitors of a switched capacitor network 135 can operate in a non-differential manner. In one such implementation, all the switchable capacitors of a switched capacitor network 135 can have their respective negative differential terminals 460 tied to ground, and their respective positive differential terminals 450 tied to the master positive node 140 (e.g., without using the master negative node 142).

Figure 7:
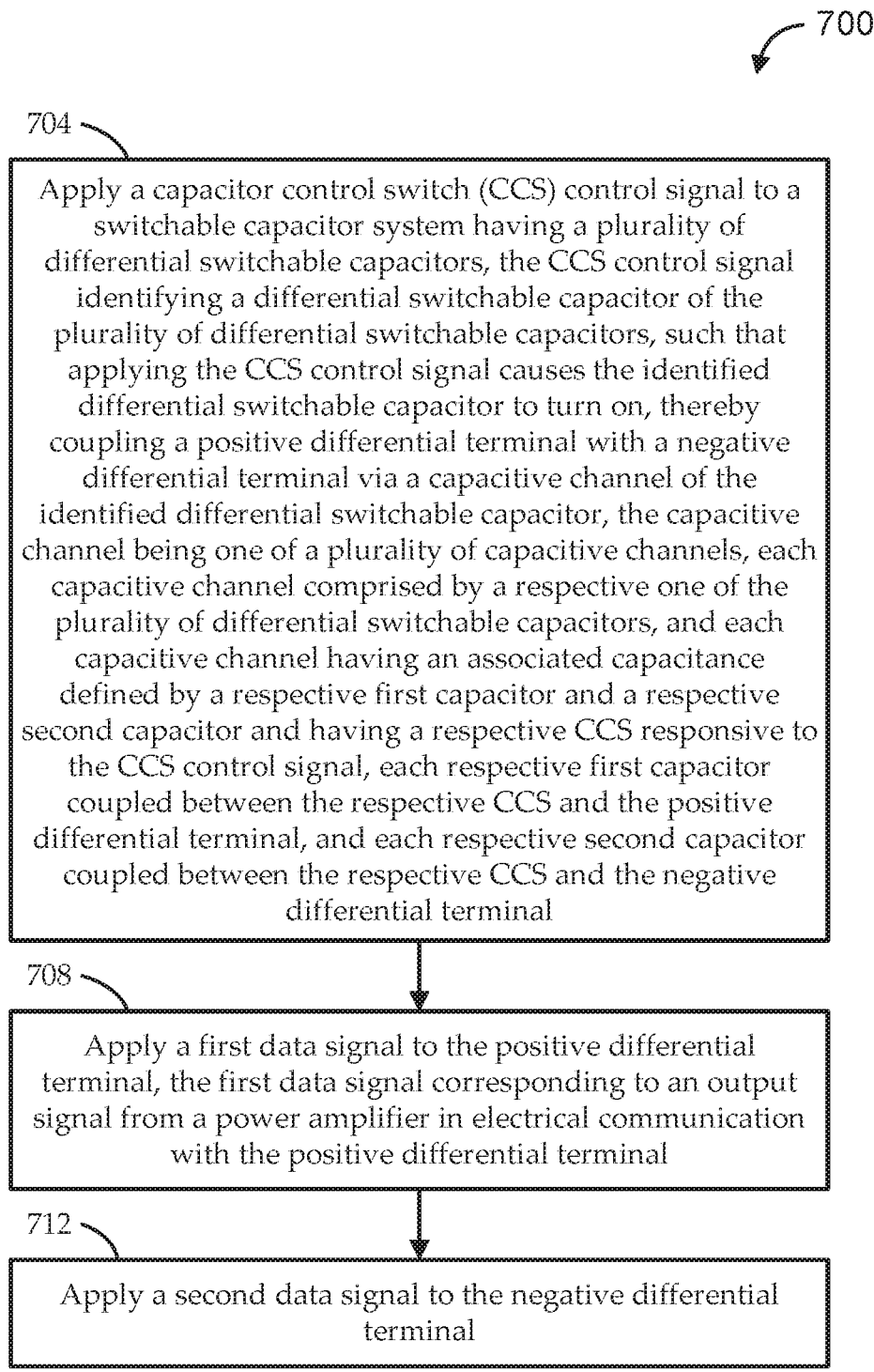
FIG. 7 shows a flow diagram of an illustrative method for tuning a resonant circuit using differential switchable capacitors, according to various embodiments.

FIG. 7 shows a flow diagram of an illustrative method 700 for tuning a resonant circuit using differential switchable capacitors, according to various embodiments. Embodiments of the method 700 can begin at stage 704 by applying a capacitor control switch (CCS) control signal to a switchable capacitor system having multiple differential switchable capacitors. The CCS control signal can identify a particular (one or more) differential switchable capacitor of the differential switchable capacitors, such that applying the CCS control signal causes the identified differential switchable capacitor to turn ON. Turning the differential switchable capacitor ON can thereby couple a positive differential terminal with a negative differential terminal via a capacitive channel of the identified differential switchable capacitor.

The capacitive channel can be one of multiple capacitive channels, each comprised by a respective one of the differential switchable capacitors. Each capacitive channel can have an associated (e.g., different) capacitance defined by a respective first capacitor and a respective second capacitor and can have a respective CCS responsive to the CCS control signal. Each respective first capacitor can be coupled between the respective CCS and the positive differential terminal, and each respective second capacitor can be coupled between the respective CCS and the negative differential terminal.

In some embodiments, applying the CCS control signal at stage 704 can include applying a high reference voltage to the respective CCS of the capacitive channel comprised by the identified differential switchable capacitor to turn ON the identified differential switchable capacitor. Concurrently, the applying at stage 704 can include applying a low control voltage to the respective CCS of at least another capacitive channel comprised by at least another of the differential switchable capacitors to turn OFF the at least another of the differential switchable capacitors. The low control voltage can be greater than zero and set to a level in accordance with the high reference voltage minus a peak signal voltage of the first data signal.

At stage 708, embodiments can apply a first data signal to the positive differential terminal. The first data signal can correspond to an output signal from a power amplifier in electrical communication with the positive differential terminal. At stage 712, embodiments can apply a second data signal to the negative differential terminal. In some embodiments, the second data signal is a complement of the first data signal.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A switchable capacitor system comprising:
   a differential switchable capacitor, comprising:
      a positive differential terminal;
      a negative differential terminal;
      a capacitor control switch (CCS) having a positive CCS node and a negative CCS node, the CCS to selectively toggle between a first mode and a second mode in response to a CCS control signal;
      a first capacitor coupled between the positive CCS node and the positive differential terminal;
      a second capacitor coupled between the negative CCS node and the negative differential terminal; and
      a switch network to selectively toggle between the first mode and the second mode in response to a switch network control signal, such that:
         in the first mode, the CCS control signal is set to a high reference voltage to electrically couple the first capacitor with the second capacitor, and the switch network is to pull the positive CCS node and the negative CCS node to a low reference voltage level; and
         in the second mode, the CCS control signal is set to a low control voltage to electrically decouple the first capacitor from the second capacitor, and the switch network is to pull the positive CCS node and the negative CCS node to the high reference voltage level, the low control voltage being greater than zero and set to a level in accordance with the high reference voltage minus a peak signal voltage.

2. The switchable capacitor system of claim 1, wherein:
   in the first mode, the CCS is turned ON, thereby electrically coupling the first capacitor with the second capacitor; and
   in the second mode, the CCS is turned OFF, thereby electrically de-coupling the first capacitor from the second capacitor.

3. The switchable capacitor system of claim 1, wherein:
the CCS is a metal-oxide semiconductor (MOS) transistor comprising the positive CCS node, the negative CCS node, and a gate node;
in the first mode, the high reference voltage is applied to the gate node as the CCS control signal to electrically couple the first capacitor with the second capacitor; and
in the second mode, the low control voltage is applied to the gate node as the CCS control signal to electrically decouple the first capacitor from the second capacitor.

4. The switchable capacitor system of claim 1, further comprising:
a master positive node; and
a master negative node,
wherein the differential switchable capacitor is one of a plurality of differential switchable capacitors,
the positive differential terminal of each of the plurality of differential switchable capacitors is coupled with the master positive node, and
the negative differential terminal of each of the plurality of differential switchable capacitors is coupled with the master negative node.

5. The switchable capacitor system of claim 4, further comprising:
a master control node to receive the CCS control signal,
wherein the plurality of differential switchable capacitors comprises N differential switchable capacitors, where N is an integer greater than one, and
the CCS control signal is an N-bit signal, each bit associated with a respective one of the differential switchable capacitors, such that each differential switchable capacitor is selectively togglable between the first mode and the second mode responsive to the associated bit of the CCS control signal.

6. The switchable capacitor system of claim 1, wherein the switch network comprises:
an inverter to generate an inverter output at an inverter output node responsive to the switch network control signal;
a first resistor coupled between the inverter output node and the positive CCS node; and
a second resistor coupled between the inverter output node and the negative CCS node.

7. The switchable capacitor system of claim 6, wherein the negative differential terminal is coupled with a ground reference.

8. The switchable capacitor system of claim 1, wherein the switch network comprises:
a first sub-network having a first switch to selectively couple the positive differential terminal with the positive CCS node and the negative CCS node in accordance with the CCS control signal; and
a second sub-network having a second switch to selectively couple the negative differential terminal with the positive CCS node and the negative CCS node in accordance with the CCS control signal,
such that in the first mode, the first sub-network is to decouple the positive CCS node and the negative CCS node from the high reference voltage level, and the second sub-network is to couple the positive CCS node and the negative CCS node to the low reference voltage level, and
such that in the second mode, the first sub-network is to couple the positive CCS node and the negative CCS node to the high reference voltage level, and the second sub-network is to decouple the positive CCS node and the negative CCS node from the low reference voltage level.

9. The switchable capacitor system of claim 8, wherein:
the first sub-network further has a first resistor coupled between the first switch and the positive CCS node, and a second resistor coupled between the first switch and the negative CCS node; and
the second sub-network further has a third resistor coupled between the second switch and the negative CCS node, and a fourth resistor coupled between the second switch and the negative CCS node.

10. The switchable capacitor system of claim 8, wherein:
the first sub-network further has a first filter capacitor in parallel with the first switch; and
the second sub-network further has a second filter capacitor in parallel with the second switch.

11. A transceiver system comprising:
a power amplifier to generate an output signal at an output terminal as a function of applying gain to an input signal; and
a resonant circuit comprising an inductor and a switchable capacitor system, the switchable capacitor system comprising a plurality of differential switchable capacitors, each differential switchable capacitor comprising:
a positive differential terminal coupled with the output terminal to receive a first differential input signal responsive to the output signal;
a negative differential terminal;
a capacitor control switch (CCS) having a positive CCS node and a negative CCS node, the CCS to selectively toggle between a first mode and a second mode in response to a CCS control signal;
a first capacitor coupled between the positive CCS node and the positive differential terminal;
a second capacitor coupled between the negative CCS node and the negative differential terminal; and
a switch network to selectively toggle between the first mode and the second mode in response to a switch network control signal, such that:
in the first mode, the CCS control signal is set to a high reference voltage to electrically couple the first capacitor with the second capacitor, and the switch network is to pull the positive CCS node and the negative CCS node to a low reference voltage level; and
in the second mode, the CCS control signal is set to a low control voltage to electrically decouple the first capacitor from the second capacitor, and the switch network is to pull the positive CCS node and the negative CCS node to the high reference voltage level, the low control voltage level being greater than zero and set to a level in accordance with the high reference voltage minus a peak signal voltage.

12. The transceiver system of claim 11, wherein:
the negative differential terminal is coupled with the output terminal to receive a second differential input signal corresponding to a complement of the first differential signal.

13. The transceiver system of claim 11, wherein:
the CCS is a metal-oxide semiconductor (MOS) transistor comprising the positive CCS node, the negative CCS node, and a gate node;
in the first mode, the high reference voltage is applied to the gate node as the CCS control signal to electrically couple the first capacitor with the second capacitor; and in the second mode, the low control voltage is applied to the gate node as the CCS control signal to electrically decouple the first capacitor from the second capacitor.

14. The transceiver system of claim 11, wherein the switch network comprises:
an inverter to generate an inverter output at an inverter output node responsive to the switch network control signal;
a first resistor coupled between the inverter output node and the positive CCS node; and
a second resistor coupled between the inverter output node and the negative CCS node.

15. The transceiver system of claim 11, wherein the switch network comprises:
a first switch and a second switch;
in the first mode, the second switch is to couple the negative differential terminal with the positive CCS node via a first resistor and to couple the negative differential terminal with the negative CCS node via a second resistor, and the first switch is to decouple the positive differential terminal from the positive CCS node and the negative CCS node; and
in the second mode, the first switch is to couple the positive differential terminal with the positive CCS node via a third resistor and to couple the positive differential terminal with the negative CCS node via a fourth resistor, and the second switch is to decouple the negative differential terminal from the positive CCS node and the negative CCS node.

16. A method for tuning a resonant circuit using differential switchable capacitors, the method comprising:
applying a capacitor control switch (CCS) control signal to a switchable capacitor system having a plurality of differential switchable capacitors, the CCS control signal identifying a differential switchable capacitor of the plurality of differential switchable capacitors, such that applying the CCS control signal causes the identified differential switchable capacitor to turn ON, thereby coupling a positive differential terminal with a negative differential terminal via a capacitive channel of the identified differential switchable capacitor,
the capacitive channel being one of a plurality of capacitive channels, each capacitive channel comprised by a respective one of the plurality of differential switchable capacitors, and each capacitive channel having an associated capacitance defined by a respective first capacitor and a respective second capacitor and having a respective CCS responsive to the CCS control signal, each respective first capacitor coupled between the respective CCS and the positive differential terminal, and each respective second capacitor coupled between the respective CCS and the negative differential terminal,
applying the CCS control signal comprising applying a high reference voltage to the respective CCS of the capacitive channel comprised by the identified differential switchable capacitor to turn ON the identified differential switchable capacitor, and applying a low control voltage to the respective CCS of at least another capacitive channel comprised by at least another of the differential switchable capacitors to turn OFF the at least another of the differential switchable capacitors, the low control voltage being greater than zero and being set to a level in accordance with the high reference voltage minus a peak signal voltage of the first data signal;
applying a first data signal to the positive differential terminal, the first data signal corresponding to an output signal from a power amplifier in electrical communication with the positive differential terminal; and
applying a second data signal to the negative differential terminal.

17. The method of claim 16, wherein the second data signal is a complement of the first data signal.

\* \* \* \* \*